(12) United States Patent
Kashiwagi et al.

(10) Patent No.: US 9,268,227 B2
(45) Date of Patent: Feb. 23, 2016

(54) UV-CURABLE ADHESIVE SILICONE COMPOSITION, UV-CURABLE ADHESIVE SILICONE COMPOSITION SHEET, OPTICAL SEMICONDUCTOR APPARATUS AND METHOD FOR MANUFACTURING THE SAME

(71) Applicant: SHIN-ETSU CHEMICAL CO., LTD., Tokyo (JP)

(72) Inventors: Tsutomu Kashiwagi, Annaka (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/728,441

(22) Filed: Jun. 2, 2015

(65) Prior Publication Data

US 2015/0261088 A1    Sep. 17, 2015

Related U.S. Application Data

(62) Division of application No. 13/731,920, filed on Dec. 31, 2012, now abandoned.

(30) Foreign Application Priority Data

Jan. 18, 2012   (JP) .................................. 2012-7890

(51) Int. Cl.

| | |
|---|---|
| *H01L 33/56* | (2010.01) |
| *G03F 7/075* | (2006.01) |
| *C09J 183/04* | (2006.01) |
| *C08L 83/04* | (2006.01) |
| *C08G 77/00* | (2006.01) |
| *G03F 7/40* | (2006.01) |
| *C08G 77/12* | (2006.01) |
| *C08G 77/20* | (2006.01) |
| *H01L 23/29* | (2006.01) |

(52) U.S. Cl.
CPC .............. *G03F 7/0751* (2013.01); *C08G 77/70* (2013.01); *C08L 83/04* (2013.01); *C09J 183/04* (2013.01); *G03F 7/0757* (2013.01); *G03F 7/40* (2013.01); *H01L 33/56* (2013.01); *C08G 77/12* (2013.01); *C08G 77/20* (2013.01); *C08G 77/80* (2013.01); *C08L 2205/02* (2013.01); *G03F 7/0758* (2013.01); *H01L 23/296* (2013.01); *H01L 2224/45144* (2013.01); *H01L 2224/48091* (2013.01); *H01L 2224/73265* (2013.01)

(58) Field of Classification Search
CPC .... C09J 183/04; G03F 7/0752; G03F 7/0751; G03F 7/0757; G03F 7/0758; H01L 33/56
See application file for complete search history.

(56) References Cited

U.S. PATENT DOCUMENTS

| | | | |
|---|---|---|---|
| 7,858,198 B2 | 12/2010 | Kashiwagi et al. | |
| 2004/0053059 A1 | 3/2004 | Mistele | |
| 2004/0094757 A1 | 5/2004 | Braune et al. | |
| 2006/0105480 A1 | 5/2006 | Boardman et al. | |
| 2007/0092736 A1 | 4/2007 | Boardman et al. | |
| 2008/0277276 A1* | 11/2008 | Gardner ................ | C12Q 1/002 204/403.06 |
| 2008/0308828 A1 | 12/2008 | Kashiwagi et al. | |
| 2009/0259002 A1* | 10/2009 | Kashiwagi ............. | C08G 77/20 525/475 |
| 2010/0256300 A1 | 10/2010 | Jandke et al. | |

FOREIGN PATENT DOCUMENTS

| | | | |
|---|---|---|---|
| JP | 2004-339482 | A | 12/2004 |
| JP | 2005-524737 | A | 8/2005 |
| JP | 2008-521252 | A | 6/2008 |
| JP | 2009-235368 | A | 10/2009 |
| JP | 2010-047646 | A | 3/2010 |

OTHER PUBLICATIONS

May 28, 2013 Extended Search Report issued in European Application No. 13000096.1.
Apr. 8, 2014 Office Action issued in Japanese Application No. 2012-007890.

* cited by examiner

*Primary Examiner* — Margaret Moore
(74) *Attorney, Agent, or Firm* — Oliff PLC

(57) ABSTRACT

A method of manufacturing an optical semiconductor apparatus includes: cutting a UV-curable adhesive silicone composition sheet into small chips; disposing the resulted chip on a surface of an optical semiconductor device; irradiating UV-rays to the chip via a photomask according to lithography; developing an uncured portion of the chip with a solvent; and heat-curing after that. The UV-curable adhesive silicone composition sheet is obtained by forming a UV-curable adhesive silicone composition into sheet-form, the UV-curable adhesive silicone composition including: (A) an organopolysiloxane having a resin structure of $R^1SiO_{3/2}$, $R^2_2SiO_{2/2}$, and $R^3_aR^4_bSiO_{(4-a-b)/2}$ units, (B) an organohydrogenpolysiloxane having a resin structure of $R^1SiO_{3/2}$, $R^2_2SiO_{2/2}$, and $R^3_cH_dSiO_{(4-c-d)/2}$ units, and (C) a photoactive catalyst. The UV-curable adhesive silicone composition is in a plastic solid state or a semi-solid state in an uncured state at room temperature.

12 Claims, 1 Drawing Sheet

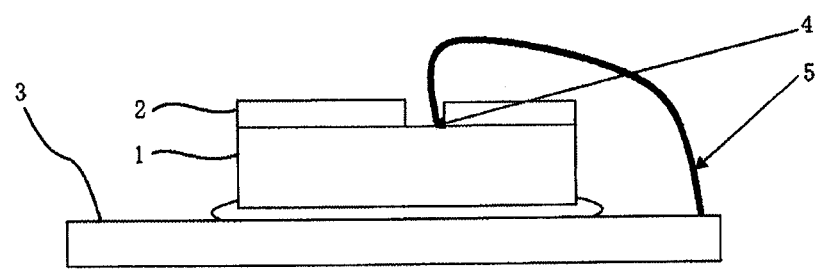

UV-CURABLE ADHESIVE SILICONE COMPOSITION, UV-CURABLE ADHESIVE SILICONE COMPOSITION SHEET, OPTICAL SEMICONDUCTOR APPARATUS AND METHOD FOR MANUFACTURING THE SAME

This is a divisional application of U.S. patent application Ser. No. 13/731,920 filed Dec. 31, 2012, and now abandoned the entire disclosure of which is incorporated herein by reference.

BACKGROUND OF THE INVENTION

1. Field of the Invention

The present invention relates to a UV-curable adhesive silicone composition, a UV-curable adhesive silicone composition sheet, an optical semiconductor apparatus, and a method for manufacturing the same.

2. Description of the Related Art

At the present time, since a silicone resin is excellent in the light resistance, it gathers an attention as a material for covering for sealing and protecting a light-emitting diode (LED) device (see Patent Literature 1). Further, in a field of light-emitting diodes, it is well known to use a phosphor as a wavelength converter (see Patent Literature 2). As a film in which a phosphor is dispersed, a thermosetting silicone resin is put into practical use (see Patent Literature 3). However, since a hydrosilylation reaction is used to cure, in many cases, a platinum-based catalyst is added in advance in a thermosetting silicone resin composition. As a result, from immediately after compounding, the reaction proceeds; accordingly, also a reaction control agent is added to secure the pot life. However, as a result thereof, a curing speed of the composition becomes slow and the composition flows during heat-curing to cause a problem of deformation of a shape thereof.

Further, in Patent Literature 4, a photocurable organopolysiloxane composition containing (methylcyclopentadienyl)trimethyl platinum as a curing catalyst is disclosed. The (methylcyclopentadienyl)trimethyl platinum is activated only when light is irradiated thereon; accordingly, under a non-irradiated state, the viscosity of the organopolysiloxane composition does not increase and the pot life is excellent. The Patent Literature 4 discloses a method where, upon irradiation of a light in an irradiation wavelength region of 200 nm to 400 nm, the (methylcyclopentadienyl)trimethyl platinum catalyst is activated to cure the organopolysiloxane composition.

However, according to a method of the Patent Literature 4, since a property before curing has fluidity, there is a problem that a resin composition flows before the organosiloxane composition is completely cured, and a cured material having a target shape can not be obtained.

Further, in some cases, it is necessary to cover only an optical semiconductor device (an LED chip, for example) or to form a bonding pad; accordingly, a film that can be patterned by lithography, which is not the conventional thermal curing type, is in demand. Still further, in LEDs, a resin layer that covers a LED chip is demanded to have also high thermal resistance and UV-ray resistance. Further, it is convenient when such a resin layer can be formed according to an existing manufacturing apparatus.

Further, generally in white LEDs, a method where by covering an LED chip with a silicone resin or an epoxy resin, in which a phosphor is dispersed, the phosphor is dispersed in the vicinity of the chip to convert a blue light into a pseudo-white light is adopted. However, when the phosphor is irregularly dispersed or unevenly concentrated, color deviation tends to occur. Accordingly, in order to obtain a uniform white light, it is necessary to uniformly disperse the phosphor in a covering resin layer. For this purpose, a method has been studied, in which, by applying a screen printing method or a sedimentation method, the phosphor is sedimented to disperse in the vicinity of a lower portion of the covering resin layer. However, there was a problem that a manufacturing step is made complicated and the degree of obtained stability is insufficient. Accordingly, an easy technology that allows to uniformly disperse a phosphor on a chip surface is in demand.

CITATION LIST

Patent Literature

[Patent Document 1] Japanese Patent Laid-Open Publication No. 2004-339482
[Patent Document 2] Japanese Translation of PCT International Application No. 2005-524737
[Patent Document 3] Japanese Patent Laid-Open Publication No. 2009-235368
[Patent Document 4] Japanese Patent Laid-Open Publication No. 2010-47646

SUMMARY OF THE INVENTION

The present invention was carried out in view of the above situation, and it is an object of the invention to provide a UV-curable adhesive silicone composition that can be cured while maintaining an initial shape without allowing a resin composition to flow during heat-curing, and, further, a UV-curable adhesive silicone composition that can form an adhesive silicone composition sheet that (1) is in a plastic solid state or a semi-solid state in an uncured state at room temperature and can be readily handled, (2) when containing a phosphor therein, can uniformly disperse the phosphor and has a stable dispersion state thereof with time, and (3) can readily cover a surface of a semiconductor device (including an optical semiconductor device such as an LED device and so on) and, by curing only a necessary portion with a UV light source and a mask, can readily form a resin cured layer.

In order to solve the problem, according to the invention, a UV-curable adhesive silicone composition that includes
(A) an organopolysiloxane having a resin structure consisting of $R^1SiO_{3/2}$, $R^2{}_2SiO_{2/2}$, and $R^3{}_aR^4{}_bSiO_{(4-a-b)/2}$ units, wherein $R^1$, $R^2$ and $R^3$ each independently represent any one of a hydroxyl group, a methyl group, an ethyl group, a propyl group, a cyclohexyl group, and a phenyl group, $R^4$ represents a vinyl group or an allyl group, a represents 0, 1 or 2, b represents 1, 2 or 3, and a+b represents 2 or 3, wherein at least a part of $R^2{}_2SiO_{2/2}$ units is continuously repeated and the number of repetitions thereof is 5 to 300,
(B) an organohydrogenpolysiloxane having a resin structure consisting of $R^1SiO_{3/2}$, $R^2{}_2SiO_{2/2}$, and $R^3{}_cH_dSiO_{(4-c-d)/2}$ units, wherein $R^1$, $R^2$ and $R^3$ each independently represent the same as that in the above, c represents 0, 1 or 2, d represents 1 or 2, and c+d represents 2 or 3, wherein at least a part of $R^2{}_2SiO_{2/2}$ units is continuously repeated and the number of repetitions thereof is 5 to 300, and
(C) a photoactive catalyst, wherein the UV-curable adhesive silicone composition is in a plastic solid state or a semi-solid state in an uncured state at room temperature is provided.

Such the UV-curable adhesive silicone composition becomes a UV-curable adhesive silicone composition that can be cured while maintaining an initial shape without allowing the resin composition to flow during heat-curing.

Further, according to the UV-curable adhesive silicone composition, a UV-curable adhesive silicone composition sheet that; is in a plastic solid state or a semi-solid state in an uncured state (that is, under non-heat treatment) at room temperature and can be readily handled; and, can readily cover a surface of an optical semiconductor device, and by curing only a necessary portion with a UV-light source and a mask, can readily form a resin cured layer can be formed.

In the present invention, the "semi-solid" means a state that does not have the fluidity while having the plasticity and shows a liquid or solid property depending on an external stress such as temperature, stress, and strain.

Further, the "room temperature" shows an environmental temperature in a usual state, usually in the range of 15 to 30° C., and typically 25° C.

Further, in this case, the UV-curable adhesive silicone composition preferably further contains (D) a phosphor.

Even when the UV-curable adhesive silicone composition contains the (D) phosphor like this, a resin cured layer in which the phosphor is uniformly dispersed and the dispersion state thereof is stable with time can be obtained.

Further, in this case, the UV-curable adhesive silicone composition preferably contains 0.1 to 100 parts by mass of the phosphor of the (D) component with respect to 100 parts by mass of a sum total of the (A) to (C) components.

When a compounding amount of the phosphor of the (D) component is set like this, a resin cured layer obtained from the UV-curable adhesive silicone composition can more surely absorb a light from the optical semiconductor device and can convert into a light of different wavelength.

Further, in this case, a particle size of the (D) phosphor is preferable to be 10 nm or more.

Like this, a particle size of the phosphor of the (D) component is preferable to be 10 nm or more, more preferable to be 10 nm to 10 μm, and particularly preferable to be 10 nm to about 1 μm.

Further, in this case, the UV-curable adhesive silicone composition preferably contains an amount of 0.1 to 4.0 by mole ratio of the total number of moles of hydrogen atoms directly bonded to silicon atoms in the (B) component with respect to the total number of moles of vinyl groups and allyl groups in the (A) component.

When a compounding amount of the (B) component is set like this, a hydrosilylation reaction between the (A) component and the (B) component is excellently proceeded.

Further, in this case, at least one of the $R^1$, $R^2$ and $R^3$ can be a hydroxyl group.

Thus, in the (A) component and/or the (B) component of the composition of the invention, a silanol group can be contained.

Further, according to the invention, a UV-curable adhesive silicone composition sheet obtained by forming the UV-curable adhesive silicone composition into sheet-form is provided.

Thus, a UV-curable adhesive silicone composition sheet obtained by forming the UV-curable adhesive silicone composition of the present invention into sheet-form is easy to handle and excellent in the workability, and can be readily adhered by stacking on a surface of an optical semiconductor device such as an LED chip. Further, the UV-curable adhesive silicone composition sheet is in a plastic solid state or a semi-solid state in an uncured state; accordingly, charged phosphor does not cause separation and precipitation during storage. Accordingly, a resin cured layer where the phosphor is uniformly dispersed therein can be stably formed.

Further, the present invention provides an optical semiconductor apparatus manufactured by using the UV-curable adhesive silicone composition sheet.

According to the optical semiconductor apparatus manufactured by using the UV-curable adhesive silicone composition sheet of the present invention, a resin cured layer that covers an optical semiconductor device has high heat resistance and light transmittance. Further, an optical semiconductor apparatus having an optical semiconductor device that is covered with the resin cured layer in which the phosphor is uniformly dispersed is obtained.

Further, the present invention provides a method of manufacturing an optical semiconductor apparatus, which includes a step of disposing the UV-curable adhesive silicone composition sheet on a surface of an optical semiconductor device, a step of irradiating light, and a step of heating after that.

When the UV-curable adhesive silicone composition sheet of the present invention is disposed on a surface of an optical semiconductor device such as an LED chip or the like, the LED chip can be readily covered. Further, when lithography is applied with a UV-light source and a mask on the sheet, only a necessary portion can be cured in gel, and, after that, by dissolving and developing an unnecessary uncured portion with a solvent, a resin cured layer can be formed only on a necessary portion.

A UV-curable adhesive silicone composition of the present invention can be cured while maintaining an initial shape without allowing the resin composition to flow during heating and curing. Further, since a UV-curable adhesive silicone composition sheet obtained by forming the composition in sheet is in a plastic solid state or a semi-solid state in an uncured state, it can be readily handled and is excellent in the workability, and can be readily stacked and adhered to a surface of a semiconductor device even with a mounting machine such as a usual die bonding machine. Further, a charged phosphor does not separate and precipitate during storage. Then, when the composition sheet is cured, a resin cured layer in which the phosphor is uniformly dispersed can be efficiently and stably formed with a uniform layer thickness. That is, the mass productivity is excellent. Further, in the resulted phosphor-containing resin cured layer, the phosphor is uniformly dispersed; accordingly, color deviation is difficult to occur, that is, the color rendering properties are excellent. Still further, the resulted cured material becomes a cured material (resin cured layer) that is, while being a hard resin, excellent in the flexibility and less in surface tackiness.

BRIEF DESCRIPTION OF THE DRAWING

FIG. 1 is a schematic diagram illustrating an LED apparatus having a flip-chip structure, which is prepared for measuring chromaticity in an example.

DESCRIPTION OF THE EMBODIMENTS

Hereinafter, the present invention will be described in more detail.

As was described above, a composition for covering an optical semiconductor device had a problem that the composition flows before completion of curing to result in being unable to obtain a cured material having a target shape and a problem that the dispersion of the phosphor in the resin layer becomes irregular or is deviated.

In this connection, a UV-curable adhesive silicone composition that can be cured while maintaining an initial shape without causing the resin composition to flow during heat-curing, and that can form an adhesive silicone composition sheet that is easy to handle, in which the phosphor is uniformly dispersed and a dispersion state thereof is stable with time is in demand.

The inventors, after studying hard to achieve the object, came to complete the present invention. That is, the present invention is a UV-curable adhesive silicone composition characterized by including:

(A) an organopolysiloxane having a resin structure consisting of $R^1SiO_{3/2}$, $R^2_2SiO_{2/2}$, and $R^3_aR^4_bSiO_{(4-a-b)/2}$ units, wherein $R^1$, $R^2$ and $R^3$ each independently represent any one of a hydroxyl group, a methyl group, an ethyl group, a propyl group, a cyclohexyl group, and a phenyl group, $R^4$ represents a vinyl group or an allyl group, a represents 0, 1 or 2, b represents 1, 2 or 3, and a+b represents 2 or 3, wherein at least a part of $R^2_2SiO_{2/2}$ units is continuously repeated and the number of repetitions thereof is 5 to 300, (B) an organohydrogenpolysiloxane having a resin structure consisting of $R^1SiO_{3/2}$, $R^2_2SiO_{2/2}$, and $R^3_cH_dSiO_{(4-c-d)/2}$ units, wherein $R^1$, $R^2$ and $R^3$ each independently represent the same as that in the above, c represents 0, 1 or 2, d represents 1 or 2, and c+d represents 2 or 3, wherein at least a part of $R^2_2SiO_{2/2}$ units is continuously repeated and the number of repetitions thereof is 5 to 300, and (C) a photoactive catalyst, wherein the UV-curable adhesive silicone composition is in a plastic solid state or a semi-solid state in an uncured state at room temperature.

Hereinafter, the invention will be described in more detail. In the following description, Me, Et, Ph and Vi respectively represent a methyl group, an ethyl group, a phenyl group and a vinyl group.

UV-Curable Adhesive Silicone Composition

—(A) Organopolysiloxane Having Resin Structure—

An organopolysiloxane having a resin structure (that is, three-dimensional network structure), which is an important (A) component of a UV-curable adhesive silicone composition of the present invention, is an organopolysiloxane that has a resin structure that consists of $R^1SiO_{3/2}$, $R^2_2SiO_{2/2}$, and $R^3_aR^4_bSiO_{(4-a-b)/2}$ units, (wherein $R^1$, $R^2$ and $R^3$ each independently represent any one of a hydroxyl group, a methyl group, an ethyl group, a propyl group, a cyclohexyl group, and a phenyl group, $R^4$ represents a vinyl group or an allyl group, a represents 0, 1 or 2, b represents 1, 2 or 3, and a+b represents 2 or 3), and the organopolysiloxane partially includes a structure where at least a part of $R^2_2SiO_{2/2}$ units is continuously repeated and the number of repetitions thereof is 5 to 300, preferably 10 to 300, more preferably 15 to 200, and still preferably 20 to 100.

A structure where at least a part of $R^2_2SiO_{2/2}$ units is continuously repeated and the number of repetitions thereof is 5 to 300, which is described above, means a linear diorganopolysiloxane chain architecture represented by a formula (1),

(1)

wherein $R^2$ represents the same as that in the above, and m represents an integer of 5 to 300.

It is preferable that at least a part of an entirety of $R^2_2SiO_{2/2}$ units present in organopolysiloxane of an (A) component, preferably 50% by mole or more (50 to 100% by mole), particularly 80% by mole or more (80 to 100% by mole) preferably forms a chain architecture represented by such a formula (1) in a molecule.

In a molecule of the (A) component, $R^2_2SiO_{2/2}$ units work to linearly stretch a polymer molecule, and $R^1SiO_{3/2}$ units make a polymer molecule to branch or form a three-dimensional network structure. $R^4$ (vinyl group or allyl group) in $R^3_aR^4_bSiO_{(4-a-b)/2}$ units plays, by undergoing a hydrosilylation addition reaction with a hydrogen atom bonded to a silicon atom (that is, SiH group) of $R^3_cH_dSiO_{(4-c-d)/2}$ units that the (B) component described below has, a role of curing the composition of the present invention.

A mole ratio of indispensable three kinds of siloxane units that constitute the (A) component, that is, a mole ratio of $R^1SiO_{3/2}$ units:$R^2_2SiO_{2/2}$ units:$R^3_aR^4_bSiO_{(4-a-b)/2}$ units is preferable to be 90 to 24:75 to 9:50 to 1, and particularly preferable to be 70 to 28:70 to 20:10 to 2 (sum total thereof is 100) from the viewpoint of the characteristics of the resulted cured material.

When an weight average molecular weight of the (A) component in terms of polystyrene according to gel permeation chromatography (GPC) with tetrahydrofuran (THF) as an eluent is in the range of 3,000 to 1,000,000, in particular, 10,000 to 100,000, the polymer is more surely in a plastic solid state or a semi-solid state and suitable from the viewpoint of workability and curability.

The organopolysiloxane having such the resin structure can be synthesized in such a manner that compounds that is raw materials of the respective units are combined so that the three kinds of siloxane units may be a predetermined mole ratio in a generated polymer, and, for example, under the presence of acid, a cohydrolysis condensation is conducted.

Herein, as a raw material of the $R^1SiO_{3/2}$ unit, chlorosilanes such as $MeSiCl_3$, $EtSiCl_3$, $PhSiCl_3$, propyltrichlorosilane and cyclohexyl trichlorosilane, and alkoxysilanes such as methoxysilanes corresponding to the respective chlorosilanes can be exemplified.

As the raw materials of the $R^2_2SiO_{2/2}$ units,
$ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$, $HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$, and
$MeOMe_2SiO(Me_2SiO)_m(Ph_2SiO)_nSiMe_2OMe$ (herein, m represents an integer (average value) from 5 to 150, and n represents an integer (average value) from 5 to 300)) can be exemplified.

Further, $R^3_aR^4_bSiO_{(4-a-b)/2}$ units indicate one kind of siloxane unit selected from $R^3R^4SiO_{2/2}$, $R^3_2R^4SiO_{1/2}$, $R^4_2SiO_{2/2}$ and $R^3R^4_2SiO_{1/2}$ units or a combination of two or more kinds of the siloxane units selected therefrom. As the raw materials thereof, chlorosilanes such as $Me_2ViSiCl$, $MeViSiCl_2$, $Ph_2ViSiCl$, and $PhViSiCl_2$, and alkoxysilanes such as methoxysilanes corresponding to each of these chlorosilanes can be exemplified.

In the present invention, when the organopolysiloxane of the (A) component is manufactured according to a cohydrolysis and condensation of the raw compounds described above, in some cases, $R^1SiO_{3/2}$ units, $R^2_2SiO_{2/2}$ units, and/or $R^3_aR^4_bSiO_{(4-a-b)/2}$ units may contain a siloxane unit having a silanol group. That is, there is a case where a siloxane unit where at least one of $R^1$, $R^2$ and $R^3$ is a hydroxyl group is contained. The organopolysiloxane of the (A) component may contain such the silanol group-containing siloxane unit, with respect to an entire siloxane units, usually by 10% by mole or less (0 to 10% by mole), preferably by 5% by mole or less (0 to 5% by mole). Examples of the silanol group-containing siloxane units include $R^1(HO)SiO_{2/2}$, $R^1(HO)_2SiO_{1/2}$, $R^2{}_2(HO)SiO_{1/2}$, $R^3R^4(HO)SiO_{1/2}$, and $R^4{}_2(HO)SiO_{1/2}$ units, wherein $R^1$ to $R^4$ are the same as that described above.

—(B) Organohydrogenpolysiloxane Having Resin Structure—

An organohydrogenpolysiloxane having a resin structure (that is, three-dimensional network structure), which is an important (B) component of the UV-curable adhesive silicone composition of the present invention is an organohydrogenpolysiloxane that has a resin structure that consists of $R^1SiO_{3/2}$, $R^2{}_2SiO_{2/2}$, and $R^3{}_cH_dSiO_{(4-c-d)/2}$ units (Here, $R^1$, $R^2$ and $R^3$ are the same as that described above, c represents 0, 1 or 2, d represents 1 or 2, and c+d represents 2 or 3, desirably among $R^3{}_cH_dSiO_{(4-c-d)/2}$ units, c represents 2 and d represents 1), the organohydrogenpolysiloxane partially contains a linear siloxane structure where at least a part of $R^2{}_2SiO_{2/2}$ units is continuously repeated and the number of repetitions is 5 to 300, preferably 10 to 300, more preferably 15 to 200, and still preferably 20 to 100.

The structure where at least a part of $R^2{}_2SiO_{2/2}$ units is continuously repeated and the number of repetitions thereof is 5 to 300 means that at least a part of $R^2{}_2SiO_{2/2}$ units present in the (B) component, preferably 50% by mole or more (50 to 100% by mole) thereof, particularly 80% by mole or more (80 to 100% by mole) thereof forms a linear diorganopolysiloxane chain architecture represented by the formula (1) in the molecule of the (B) component.

Also in a molecule of the (B) component, $R^2{}_2SiO_{2/2}$ units work to linearly stretch a polymer molecule, and $R^1SiO_{3/2}$ units make a polymer molecule to branch or form a three-dimensional network structure. A hydrogen atom bonded to silicon in $R^3{}_cH_dSiO_{(4-c-d)/2}$ units plays, by undergoing a hydrosilylation addition reaction with an alkenyl group that the (A) component has, a role of curing a composition of the present invention.

A mole ratio of indispensable three kinds of siloxane units that constitute the (B) component, that is, a mole ratio of $R^1SiO_{3/2}$ units:$R^2{}_2SiO_{2/2}$ units: $R^3{}_cH_dSiO_{(4-c-d)/2}$ units is preferable to be 90 to 24:75 to 9:50 to 1, and particularly preferable to be 70 to 28:70 to 20:10 to 2 (sum total thereof is 100) from the viewpoint of the characteristics of the resulted cured material.

When a weight average molecular weight of the (B) component in terms of polystyrene according to the GPC with tetrahydrofuran (THF) as an eluent is in the range of 3,000 to 1,000,000, in particular, 10,000 to 100,000, the polymer is suitable from the viewpoint of workability and characteristics of the cured material.

The organohydrogenpolysiloxane having such the resin structure can be synthesized in such a manner that compounds that is raw materials of the respective units are combined so that the three kinds of siloxane units may be a predetermined mole ratio in a generated polymer, and, a cohydrolysis is conducted.

Herein, as the raw materials of the $R^1SiO_{3/2}$ unit, $MeSiCl_3$, $EtSiCl_3$, $PhSiCl_3$, propyltrichlorosilane, cyclohexyl trichlorosilane, and alkoxysilanes such as methoxysilanes corresponding to the respective chlorosilanes can be cited.

As the raw materials of the $R^2{}_2SiO_{2/2}$ units,
$ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$, $HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$, and
$MeOMe_2SiO(Me_2SiO)_m(Ph_2SiO)_nSiMe_2OMe$ (herein, m represents an integer (average value) of 5 to 150, and n represents an integer (average value) of 5 to 300)) can be exemplified.

Further, $R^3{}_cH_dSiO_{(4-c-d)/2}$ units indicates one kind of siloxane unit selected from $R^3HSiO_{2/2}$, $R^3{}_2HSiO_{1/2}$, $H_2SiO_{2/2}$ and $R^3H_2SiO_{1/2}$ units or an optional combination of two or more kinds of siloxane units selected therefrom. As the raw materials thereof, chlorosilanes such as $Me_2HSiCl$, $MeHSiCl_2$, $Ph_2HSiCl$, and $PhHSiCl_2$, and alkoxysilanes such as methoxysilanes corresponding to each of the chlorosilanes can be exemplified.

In the present invention, when the organohydrogenpolysiloxane of the (B) component is prepared according to a cohydrolysis and condensation of the raw compounds, in some cases, $R^1SiO_{3/2}$, $R^2{}_2SiO_{2/2}$, and $R^3{}_cH_dSiO_{(4-c-d)/2}$ units may contain a siloxane unit having a silanol group. That is, in some cases, there is a case where a siloxane unit where at least one of $R^1$, $R^2$ and $R^3$ is a hydroxyl group is contained. The organohydrogenpolysiloxane of the (B) component may contain such the silanol group-containing siloxane unit, usually, with respect to an entire siloxane units, by an amount of 10% by mole or less (0 to 10% by mole), preferably 5% by mole or less (0 to 5% by mole). Examples of the silanol group-containing siloxane units include $R^1(HO)SiO_{2/2}$, $R^1(HO)_2SiO_{1/2}$, $R^2{}_2(HO)SiO_{1/2}$, $R^3H(HO)SiO_{1/2}$, and $H_2(HO)SiO_{1/2}$ units, wherein $R^1$ to $R^3$ are the same as that described above.

A compounding amount of the organohydrogenpolysiloxane of the (B) component is, in terms of a mole ratio of hydrogen atoms bonded to silicon atoms (SiH groups) in the (B) component with respect to a total amount of vinyl groups and ally groups in the (A) component, preferably an amount to be 0.1 to 4.0, particularly preferably an amount to be 0.5 to 3.0, and still more preferably an amount to be 0.8 to 2.0. When the compounding amount is 0.1 or more, a curing reaction preferably proceeds to be able to obtain a silicone cured material, and when the compounding amount is 4.0 or less, unreacted (residual) SiH groups in the cured material are contained less and there is no fear of change with time of physical properties of the cured material.

—(C) Photoactive Catalyst—

In hitherto known thermosetting silicone resin compositions, in many cases, a platinum-based catalyst that is not photoactive is added in advance (Patent Literature 3, for example). The present invention is characterized by using a photoactive catalyst as a catalyst. The (C) component is not restricted to particular one as long as it is a catalyst having a photoactive property, particularly a photoactive platinum group metal catalyst or nickel-based catalyst can be cited. Examples of the platinum group metal catalysts include a platinum-based catalyst, a palladium-based catalyst and a rhodium-based catalyst. Among these, the platinum-based catalyst is preferred. As the platinum-based catalysts, β-diketonate platinum complex catalysts such as trimethyl(acetylacetonate)platinum complexes, trimethyl(3,5-heptanedionate)platinum complexes, trimethyl(methylacetoacetate) platinum complexes, bis(2,4-pentanedionato)platinum complexes, bis(2,4-hexanedionato)platinum complexes, bis (2,4-heptanedionato)platinum complexes, bis(3,5-heptanedionato)platinum complexes, bis(1-phenyl-1,3-butanedionato)platinum complexes and bis(1,3-diphenyl-1,3-propanedionato)platinum complexes can be exemplified. Further, (methylcyclopentadienyl)trimethyl platinum can be used. Examples of the nickel-based catalysts include bis(2,4-pentanedionato)nickel complexes. These catalysts may be used singularly or in a combination of two or more kinds thereof. In particular, bis(2,4-pentanedionato)platinum complexes, whose trivial name is bis(acetylacetonato) platinum (II), is preferably used in the curing method of the present invention.

A compounding amount of the (C) component may be an effective amount for curing, and, usually, is used, with respect to a total amount of the (A) component and (B) component, in terms of mass as platinum group metal, for example, in the range of 0.1 to 1000 ppm, particularly preferably 0.5 to 500 ppm.

According to a UV-curable adhesive silicone composition containing the (A) to (C) components, the resin composition does not flow during heat-curing and can be cured with an initial shape maintained. Further, from the composition, an adhesive silicone composition sheet that is in a plastic solid state or semi-solid state in an uncured state at room temperature and can be readily handled can be formed. Further, the adhesive silicone composition sheet can be readily adhered to a surface of a semiconductor device (including an optical semiconductor device such as an LED device), and, by curing only a necessary portion with a UV-light source and a mask, a resin cured layer can be readily formed only on a necessary portion.

In the UV-curable adhesive silicone composition of the present invention, in addition to the above-described (A) to (C) components, as required, various kinds of additives that are heretofore-known can be compounded.

—(D) Phosphor—

When the UV-curable adhesive silicone composition of the present invention is used to form a resin layer that coats an LED device, the composition preferably contains, in addition to the above-described (A) to (C) components, (D) a phosphor for converting a wavelength. The UV-curable adhesive silicone composition of the present invention, even in the case where (D) the phosphor is contained like this, can obtain a resin cured layer where the phosphor is uniformly dispersed and a state of dispersion is stable with time.

The phosphor of the (D) component may be any of heretofore known phosphors and a compounding amount thereof is usually set in the range of 0.1 to 100 parts by mass with respect to 100 parts by mass of a total amount of the (A) to (C). The phosphor of the (D) component that has, as a range of a particle size in the particle size distribution measurement according to a laser light diffraction method using a Cirrus laser measurement apparatus, etc., a particle size of, usually, 10 nm or more, preferably 10 nm to 10 more preferably about 10 nm to 1 m is used.

A phosphor may be, for example, a material that absorbs a light from a semiconductor light-emitting diode that has a nitride-based semiconductor as a light-emitting layer and converts to a light having a different wavelength. At least one or more selected from nitride-based phosphors and oxynitride-based phosphors mainly activated by a lanthanoid element such as Eu or Ce; alkali earth halogen apatite phosphors, alkali earth metal halogen borate phosphors, alkali earth metal aluminate phosphors, alkali earth silicate phosphors, alkali earth sulfide phosphors, alkali earth thiogallate phosphors, alkali earth silicon nitride phosphors, and germinate phosphors mainly activated by a lanthanoid element such as Eu or a transition metal element such as Mn; or rare earth aluminate phosphors, rare earth silicate phosphors mainly activated by a lanthanoid element such as Ce; or organic and organo complex phosphors, Ca—Al—Si—O—N-based oxynitride glass phosphors mainly activated by a lanthanoid element such as Eu is preferred. As specific examples thereof, the following phosphors can be used without limiting thereto.

As the nitride-based phosphors mainly activated by a lanthanoid element such as Eu, Ce, $M_2Si_5N_8$:Eu (M is at least one kind selected from Sr, Ca, Ba, Mg and Zn.) can be cited. Further, in addition to $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (M is at least one kind selected from Sr, Ca, Ba, Mg and Zn.) can be cited.

As the oxynitride-based phosphors mainly activated by a lanthanoid element such as Eu, Ce include $MSi_2O_2N_2$:Eu (M is at least one kind selected from Sr, Ca, Ba, Mg and Zn.) can be cited.

As the alkali earth halogen apatite phosphors mainly activated by a lanthanoid element such as Eu and/or a transition metal element such as Mn, $M_5(PO_4)_3X$:R (M is at least one kind selected from Sr, Ca, Ba, Mg and Zn. X is at least one kind selected from F, Cl, Br and I. R is at least one kind of Eu, Mn, and Eu and Mn.) can be cited.

As the alkali earth metal halogen borate phosphors, $M_2B_5O_9X$:R (M is at least one kind selected from Sr, Ca, Ba, Mg and Zn. X is at least one kind selected from F, Cl, Br and I. R is least one kind of Eu, Mn, and Eu and Mn.) can be cited.

As the alkali earth metal aluminate phosphors, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least any one kind of Eu, Mn, and Eu and Mn.) can be cited.

As the alkali earth metal sulfide phosphors, $La_2O_2S$:Eu, $Y_2O_2S$:Eu, and $Gd_2O_2S$:Eu can be cited.

As the rare earth aluminate phosphors mainly activated by a lanthanoid element such as Ce, YAG series phosphors represented by a compositional formula such as $Y_3Al_5O_{12}$:Ce $(Y_{0.8}Gd_{0.2})_3Al_5O_{12}$:Ce, $Y_3(Al_{0.8}Ga_{0.2})_5O_{12}$: Ce and $(Y,Gd)_3(Al,Ga)_5O_{12}$ can be cited. Further, $Tb_3Al_5O_{12}$: Ce and $Lu_3Al_5O_{12}$:Ce, in which Y is partially or entirely substituted with Tb or Lu, etc. can be cited.

As other phosphors, ZnS:Eu, $Zn_2GeO_4$:Mn, and $MGa_2S_4$: Eu (M is at least one kind selected from Sr, Ca, Ba, Mg and Zn. X is at least one kind selected from F, Cl, Br and I.) can be cited.

The above phosphors may contain, as required, in place of Eu, or in addition to Eu, one or more kind selected from Tb, Cu, Ag, Au, Cr, Nd, Dy, Co, Ni and Ti.

The Ca—Al—Si—O—N series oxynitride glass phosphor includes, as a matrix, an oxynitride glass that contains, by mole %, 20 to 50% by mole of $CaCO_3$ in terms of CaO, 0 to 30% by mole of $Al_2O_3$, 25 to 60% by mole of $SiO$, 5 to 50% by mole of AlN, and 0.1 to 20% by mole of rare earth oxide or transition metal oxide, the sum total of 5 components being 100% by mole. In the phosphor of which matrix is oxynitride glass, a content of nitrogen is preferable to be 15% by weight or less, and, in addition to a rare earth oxide ion, another rare earth element ion that becomes a sensitizer is preferably contained as a co-activator as a rare earth oxide in the content in the range of 0.1 to 10% by mole in a phosphorescent glass.

Further, also phosphors other than the above phosphors, which have the same performance and effects as that mentioned above can be used.

Inorganic Filler:

Examples of the inorganic fillers include: reinforcing inorganic fillers such as fumed silica and fumed titanium dioxide; and nonreinforcing inorganic fillers such as calcium carbonate, calcium silicate, titanium dioxide, ferric oxide, carbon black, and zinc oxide. These inorganic fillers can be appropriately compounded in total in the range of 600 parts by mass or less (0 to 600 parts by weight) with respect to a sum total of 100 parts by mass of the (A) component and (B) component.

Adhesive Auxiliary:

Further, in the composition of the present invention, in order to further impart the adhesiveness, an adhesive auxiliary may be added, as required. As the adhesive auxiliary, linear or cyclic organosiloxane oligomer having 4 to 50, preferably about 4 to 20 silicon atoms, which contains in one molecule at least two kinds, preferably two kinds or three kinds of functional groups selected from a hydrogen atom bonded to a silicon atom (SiH group), an alkenyl group bonded to a silicon atom (Si—CH=CH$_2$ group, for example), an alkoxysilyl group (trimethoxysilyl group, for example), and an epoxy group (glycidoxypropyl group, 3,4-epoxycyclohexylethyl group, for example), and an organooxysilyl-modified isocyanurate compound represented by the following formula (2) and/or a hydrolytic condensate thereof (organosiloxane-modified isocyanurate compound) can be cited.

a vinyl group, an allyl group, an isopropenyl group, a butenyl group, an isobutenyl group, a pentenyl group and a hexenyl group and cycloalkenyl groups having 6 to 8 carbon atoms such as a cyclohexenyl group can be cited. Further, as the monovalent hydrocarbon groups of $R^{20}$ in the formula (3), monovalent hydrocarbon groups having 1 to 8, particularly 1 to 6 carbon atoms such as alkyl groups such as a methyl group, an ethyl group, a propyl group, an isopropyl group, a butyl group, an isobutyl group, a tert-butyl group, a pentyl group, a hexyl group and a cyclohexyl group; alkenyl groups and cycloalkenyl groups exemplified of the $R^{19}$; and aryl groups such as a phenyl group can be cited, and alkyl groups are preferably cited.

Further, as the adhesive auxiliaries, compounds represented by the following formulas can be exemplified.

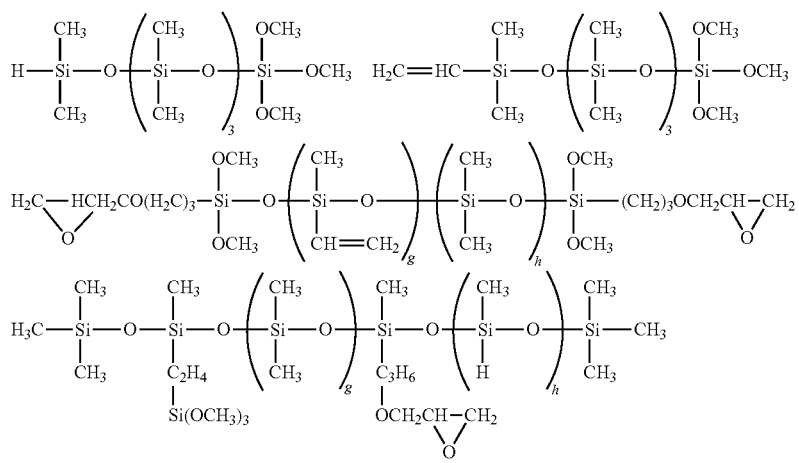

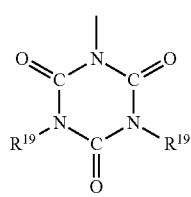

Wherein $R^{19}$ represents an organic group represented by the following formula (3),

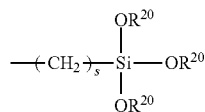

wherein $R^{20}$ represents a hydrogen atom or a mono-valent hydrocarbon group having 1 to 6 carbon atoms, s represents an integer of 1 to 6, in particular, 1 to 4.) or a mono-valent hydrocarbon group containing an aliphatic unsaturated bond, and at least one of $R^{19}$ is an organic group of the formula (3).

As the monovalent hydrocarbon groups that contains an aliphatic unsaturated bond of $R^{19}$ in the formula (2), alkenyl groups having 2 to 8, particularly 2 to 6 carbon atoms, such as (In the formula, g and h each represent a positive integer in the range of 0 to 50, and g+h satisfies 2 to 50, preferably 4 to 20.)

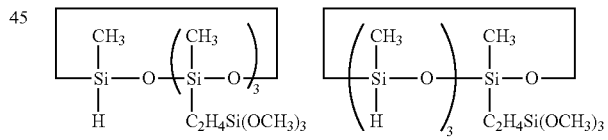

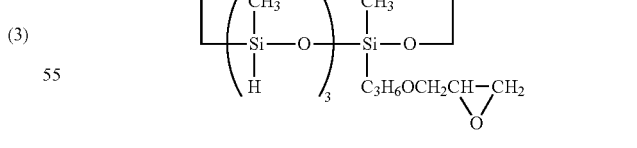

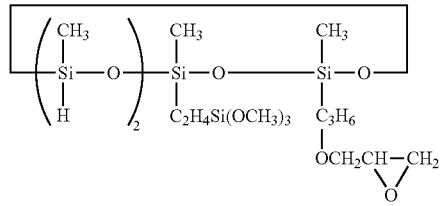

-continued

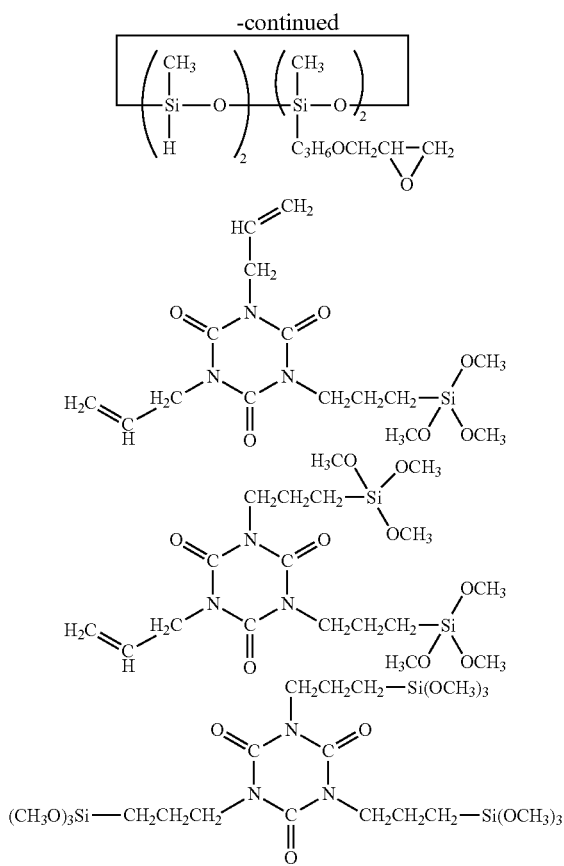

Among the organosilicon compounds, as compounds that can impart particularly excellent adhesiveness to the resulted cured material, organosilicon compounds having, in one molecule, an alkoxy group bonded to a silicon atom, and an alkenyl group or a hydrogen atom bonded to a silicon atom (SiH group) can be cited.

A compounding amount of the adhesive auxiliary is, with respect to 100 parts by mass of the (A) component, usually 10 parts by mass or less (that is, 0 to 10 parts by mass), preferably 0.1 to 8 parts by mass, more preferably 0.2 to 5 parts by mass. When the compounding amount is 10 parts by mass or less, there is no fear of adversely affecting on the hardness of the cured material or of enhancing the surface tackiness.

Further, as required, a liquid silicone component can be added to an extent that can maintain the UV-curable adhesive silicone composition of the present invention in a plastic solid state or a semi-solid state at room temperature and does not allow to be liquid. As such the liquid silicone component, a silicone component having the viscosity at 25° C. of 1 to 100,000 mPa·s is preferred. Examples thereof include vinylsiloxane, hydrogensiloxane, alkoxysiloxane, hydroxysiloxane and mixtures thereof. An addition amount of the liquid silicone component is usually 50% by mass or less with respect to the UV-curable adhesive silicone composition under the condition that the UV-curable adhesive silicone composition maintains a plastic solid state or a semi-solid state at room temperature.

UV-Curable Adhesive Silicone Composition Sheet

A UV-curable adhesive silicone composition sheet of the present invention is obtained by forming the UV-curable adhesive silicone composition of the invention into sheet-form.

As a method for processing the composition of the present invention into sheet-form, for example, a film coater and a heat press machine can be cited. When the composition is processed into sheet-form by using these methods, for example, the composition is sandwiched between a base film for pressurizing and a peeling film and compression molded by using a heat press machine at a temperature usually from 60 to 120° C., preferably from 70 to 100° C., under the pressure of 0.5 to 10 t/cm$^2$, preferably 1 to 7 ton/cm$^2$, and for about 1 to about 30 min, preferably 2 to 10 min.

Examples of the base films for pressurizing include a PET film, a fluorine-based resin film, a polyethylene film, and a polypropylene film, and examples of the peeling films include a fluorine-based resin-coated PET film, a silicone resin-coated PET film and a fluorine-based resin film can be cited.

A UV-curable adhesive silicone composition sheet formed from such the UV-curable adhesive silicone composition is in a plastic solid state or in a semi-solid state in an uncured state at room temperature and easy to handle. Further, the UV-curable adhesive silicone composition sheet can be readily adhered on a surface of a semiconductor device such as an LED chip. Further, by curing only a necessary portion with a UV-light source and a mask and by dissolving and developing an unnecessary uncured portion with a solvent, the sheet can form a cured layer only on a necessary portion is formed. Further, when the UV-curable adhesive silicone composition of the present invention contains a phosphor, a cured material (resin-cured layer) in which the phosphor is uniformly dispersed and the dispersion state thereof is stable with time can be obtained.

Examples of the UV light sources used in the present invention include UV-LED lamps, high-pressure mercury lamps, ultra-high pressure mercury lamps, low-pressure mercury lamps, metal halide lamps, carbon ark lamps, and xenon lamps. A wavelength of light being irradiated is 200 nm to 400 nm, preferably 250 to 400 nm, and any one of a single-wavelength light, a bright line spectrum light and a continuous spectrum light can be used. An exposure dose is, as an integral of light, 100 mJ/cm$^2$ to 100,000 mJ/cm$^2$, preferably 100 mJ/cm$^2$ to 10,000 mJ/cm$^2$, more preferably 100 mJ/cm$^2$ to 5,000 mJ/cm$^2$. When the exposure dose is in the above range, the silicone resin composition can be gelated by irradiating a light for a very short time. The gelation in the present invention means a state where a curing reaction of the resin composition partially proceed and the resin composition become insoluble to a solvent.

The UV-curable adhesive silicone composition sheet of the present invention is characterized in that, when a light having a specified wavelength is irradiated, the silicone resin composition is gelated. When a light having a specified wavelength is irradiated for 0.5 to 10 sec, in particular, for 1 to 5 sec, for example, on the silicone resin composition, thereafter, within 10 to 600 sec, particularly within 60 to 300 sec, the silicone resin composition can be gelated.

Then, by heating, the gelated sheet can be completely cured. Thereby, the resin composition can be cured without flowing during heating, that is, with an initial shape maintained. The resin composition is heat-cured at 25 to 200° C., preferably 100 to 180° C., for 3 min to 72 hr, preferably for 1 to 6 hr. The heat-curing condition can be appropriately selected by considering a balance of the working condition and the productivity and the heat resistance of a light-emitting device and a chassis.

Optical Semiconductor Apparatus and Manufacturing Method Thereof

According to the present invention, a method for manufacturing an optical semiconductor apparatus is provided, the method including a step of disposing the UV-curable adhesive silicone composition sheet on a surface of an optical semiconductor device (an LED device, for example), a step of irradiating light, and a step of, after that, heat-curing. According to the method, a light-emitting apparatus having a coated LED device where a surface of above-described LED device is covered with a resin-cured layer.

In a method for manufacturing an optical semiconductor apparatus, which uses such the adhesive silicone composition sheet, the adhesive silicone composition sheet is used at a thickness of 1 to 500 μm, preferably of 10 to 300 μm. However, the thickness is appropriately adjusted depending on the content and emission efficiency of the phosphor, etc. A size of the sheet may well be adjusted to a size of an LED device to be covered. After disposing the sheet on a surface of the LED device, light is irradiated to gel, after that, by heating, the sheet is completely cured. The conditions of UV irradiation and heat-curing are as described above, and, usually, after a first curing, a second curing is conducted.

Thus, by using the adhesive silicone composition sheet of the present invention, according to lithography that uses a UV light source and a mask, by curing only a necessary portion and by dissolving and developing an unnecessary uncured portion with a solvent, a resin-cured layer can be readily formed only on a necessary portion.

Cured Material (Resin Cured Layer)

The cured material obtained from the UV-curable adhesive silicone composition and the UV-curable adhesive silicone composition sheet are excellent in the heat resistance and light transmittance. Further, the present invention can provide a cured material having the light transmittance of 90% to 100%, in particular, 95% to 100% of a light having a wavelength of 450 nm at 23° C. in a layer state of a thickness of 1 mm. Accordingly, the cured material can be preferably used as a sealing material, etc. of optical semiconductor devices such as light-emitting diodes (LEDs), organic electroluminescent devices (organic ELs), laser diodes, and LED arrays. The reason why the transmittance is obtained at a thickness of 1 mm is because when a lens is formed by covering an LED chip, a thickness of the lens is about 1 mm.

An aspect of sealing an optical semiconductor device with the cured material of the UV-curable adhesive silicone composition of the present invention is not particularly limited. However, for example, a method where the above silicone resin composition is filled so that an optical semiconductor device disposed in a chassis having an opening is covered, and UV-rays are irradiated to heat to cure can be used. Further, a method where optical semiconductor devices are mounted on a matrixed substrate and a printing method, a transfer molding method, an injection molding method, or a compression molding method is used to produce can be used as well.

The silicone resin composition of the present invention is in a plastic solid state or a semi-solid state at room temperature. However, when the silicone resin composition is preheated at a temperature of about 40 to 120° C., preferably 80 to 100° C., the resin composition is softened and melted and becomes a property that allows to injection mold.

When the optical semiconductor device is covered and protected by potting or injection method, the composition is preferable to be in a liquid state when it is cast. Further, when an optical semiconductor apparatus is produced by transfer molding, the composition may be pelletized and used in molding.

When the transfer molding or injection molding is adopted, it is preferable to mold at a temperature of 150 to 180° C. and under pressure of 20 to 50 kgf/cm$^2$ for 1 to 5 min. When the transfer molding or injection molding is used, after-cure (secondary curing or post cure) may be conducted under the condition of a temperature of 150 to 200° C. for 1 to 4 hr.

The compression bonding can be usually applied at a temperature from room temperature to 300° C. or less, under pressure of 10 MPa or less (usually 0.01 to 10 MPa), preferably 5 MPa or less (0.1 to 5 MPa, for example), particularly preferably 0.5 to 5 MPa. The curing is performed usually at a temperature from 50 to 200° C., particularly, from 70 to 180° C., and for 1 to 30 min, particularly for 2 to 10 min. Further, the post cure can be conducted at a temperature from 50 to 200° C., particularly 70 to 180° C. for 0.1 to 10 hr, particularly for 1 to 4 hr.

EXAMPLES

Hereinafter, the present invention will be specifically described with reference to Synthesis Examples, Examples and Comparative Examples. However, the present invention is not limited by the following Examples. Further, Ph denotes a phenyl group, Me denotes a methyl group, and Vi denotes a vinyl group.

The weight average molecular weight referred in the present invention indicates a weight average molecular weight based on a polystyrene standard material according to gel permeation chromatography (GPC) measured under the following condition.

[Measurement Condition]
ELUENT: THF
Flow rate: 0.6 mL/min
Detector: Differential Refractive Index Detector (RI)
Column: TSK Guard Column Super H-L
TSK-Gel Super H4000 (6.0 mm I. D.×15 cm×1)
TSK-Gel Super H3000 (6.0 mm I. D.×15 cm×1)
TSK-Gel Super H2000 (6.0 mm I. D.×15 cm×2)
(all manufactured by Tosoh Corporation)
Column temperature: 40° C.
Injected amount of sample: 20 μL (THF solution of a concentration of 0.5% by mass)

Synthesis Example 1

—Vinyl Group-Containing Organopolysiloxane Resin (A1)—

After dissolving 27 mol of organosilane represented as PhSiCl$_3$, 1 mol of ClMe$_2$SiO(Me$_2$SiO)$_{33}$SiMe$_2$Cl and 6 mol of Me$_2$ViSiCl in a toluene solvent, a toluene solution was dropped in water and cohydrolyzed, further after cleaning with water, and neutralizing and dewatering by alkali cleaning, by stripping the solvent, a vinyl group-containing resin (A1) was synthesized.

In the resin, a constituent ratio of siloxane units which constitute the resin and a structure represented by [—SiMe$_2$O-(Me$_2$SiO)$_{33}$—SiMe$_2$O$_{2/2}$] is denoted by a formula: [PhSiO$_{3/2}$]$_{0.27}$[—SiMe$_2$O-(Me$_2$SiO)$_{33}$—SiMe$_2$O$_{2/2}$]$_{0.01}$[Me$_2$ViSiO$_{1/2}$]$_{0.06}$. The weight average molecular weight of the resin was 65,000, and the melting point thereof was 58° C.

Synthesis Example 2

—Hydrosilyl Group-Containing Organopolysiloxane Resin (B1)—

After dissolving 27 mol of organosilane represented as PhSiCl$_3$, 1 mol of ClMe$_2$SiO(Me$_2$SiO)$_{33}$SiMe$_2$Cl, and 6 mol of Me$_2$HSiCl in a toluene solvent, a toluene solution was dropped in water and cohydrolyzed, further after cleaning with water, and neutralizing and dewatering by alkali cleaning, by stripping the solvent, a hydrosilyl group-containing resin (B1) was synthesized.

In the resin, a constituent ratio of siloxane units which constitute the resin and a structure represented by [—SiMe$_2$O-(Me$_2$SiO)$_{33}$—SiMe$_2$O$_{2/2}$] is denoted by a formula: [PhSiO$_{3/2}$]$_{0.27}$ [—SiMe$_2$O-(Me$_2$SiO)$_{33}$—SiMe$_2$O$_{2/2}$]$_{0.01}$[Me$_2$HSiO$_{1/2}$]$_{0.06}$. The weight average molecular weight of the resin was 56,000, and the melting point thereof was 56° C.

Synthesis Example 3

—Vinyl Group-Containing Organopolysiloxane Resin (A2)—

After dissolving 27 mol of organosilane represented as PhSiCl$_3$, 1 mol of ClMe$_2$SiO(Me$_2$SiO)$_{33}$SiMe$_2$Cl, and 9 mol of Me$_2$ViSiCl in a toluene solvent, a toluene solution was dropped in water and cohydrolyzed, further after cleaning with water, and neutralizing and dewatering by alkali cleaning, by stripping the solvent, a vinyl group-containing resin (A2) was synthesized.

In the resin, a constituent ratio of siloxane units which constitute the resin and a structure represented by [—SiMe$_2$O-(Me$_2$SiO)$_{33}$—SiMe$_2$O$_{2/2}$] is denoted by a formula: [PhSiO$_{3/2}$]$_{0.27}$[—SiMe$_2$O-(Me$_2$SiO)$_{33}$—SiMe$_2$O$_{2/2}$]$_{0.01}$[Me$_2$ViSiO$_{1/2}$]$_{0.09}$. The weight average molecular weight of the resin was 62,000, and the melting point thereof was 61° C.

Synthesis Example 4

—Hydrosilyl Group-Containing Organopolysiloxane Resin (B2)—

After dissolving 27 mol of organosilane represented as PhSiCl$_3$, 1 mol of ClMe$_2$SiO(Me$_2$SiO)$_{33}$SiMe$_2$Cl, and 9 mol of Me$_2$HSiCl in a toluene solvent, a toluene solution was dropped in water and cohydrolyzed, further after cleaning with water, and neutralizing and dewatering by alkali cleaning, by stripping the solvent, a hydrosilyl group-containing resin (B2) was synthesized.

In the resin, a constituent ratio of siloxane units which constitute the resin and a structure represented by [—SiMe$_2$O-(Me$_2$SiO)$_{33}$—SiMe$_2$O$_{2/2}$] is denoted by a formula: [PhSiO$_{3/2}$]$_{0.27}$ [—SiMe$_2$O-(Me$_2$SiO)$_{33}$—SiMe$_2$O$_{2/2}$]$_{0.01}$[Me$_2$HSiO$_{1/2}$]$_{0.09}$. The weight average molecular weight of the resin was 55,000, and the melting point thereof was 54° C.

Synthesis Example 5

—Vinyl Group-Containing Organopolysiloxane Resin (A3)—

After dissolving 27 mol of organosilane represented as PhSiCl$_3$, 1 mol of ClMe$_2$SiO(Me$_2$SiO)$_7$SiMe$_2$Cl, and 6 mol of Me$_2$ViSiCl in a toluene solvent, a toluene solution was dropped in water and cohydrolyzed, further after cleaning with water, and neutralizing and dewatering by alkali cleaning, by stripping the solvent, a vinyl group-containing resin (A3) was synthesized.

In the resin, a constituent ratio of siloxane units which constitute the resin and a structure represented by [—SiMe$_2$O-(Me$_2$SiO)$_7$—SiMe$_2$O$_{2/2}$] is denoted by a formula: [PhSiO$_{3/2}$]$_{0.27}$[—SiMe$_2$O-(Me$_2$SiO)$_7$—SiMe$_2$O$_{2/2}$]$_{0.01}$[Me$_2$ViSiO$_{1/2}$]$_{0.06}$. The weight average molecular weight of the resin was 45,000, and the melting point thereof was 56° C.

Synthesis Example 6

—Hydrosilyl Group-Containing Organopolysiloxane Resin (B3)—

After dissolving 27 mol of organosilane represented as PhSiCl$_3$, 1 mol of ClMe$_2$SiO(Me$_2$SiO)$_7$SiMe$_2$Cl, and 6 mol of Me$_2$HSiCl in a toluene solvent, a toluene solution was dropped in water and cohydrolyzed, further after cleaning with water, and neutralizing and dewatering by alkali cleaning, by stripping the solvent, a hydrosilyl group-containing resin (B3) was synthesized.

In the resin, a constituent ratio of siloxane units which constitute the resin and a structure represented by [—SiMe$_2$O-(Me$_2$SiO)$_7$—SiMe$_2$O$_{2/2}$] is denoted by a formula: [PhSiO$_{3/2}$]$_{0.27}$[—SiMe$_2$O-(Me$_2$SiO)$_7$—SiMe$_2$O$_{2/2}$]$_{0.01}$[Me$_2$HSiO$_{1/2}$]$_{0.06}$. The weight average molecular weight of the resin was 42,000, and the melting point thereof was 54° C.

Synthesis Example 7

—Vinyl Group-Containing Organopolysiloxane Resin (A4)—

After dissolving 27 mol of organosilane represented as PhSiCl$_3$, 1 mol of HOMe$_2$SiO(Me$_2$SiO)$_{98}$SiMe$_2$OH, and 6 mol of Me$_2$ViSiCl in a toluene solvent, a toluene solution was dropped in water and cohydrolyzed, further after cleaning with water, and neutralizing and dewatering by alkali cleaning, by stripping the solvent, a vinyl group-containing resin (A4) was synthesized.

In the resin, a constituent ratio of siloxane units which constitute the resin and a structure represented by [—SiMe$_2$O-(Me$_2$SiO)$_{98}$—SiMe$_2$O$_{2/2}$] is denoted by a formula: [PhSiO$_{3/2}$]$_{0.27}$[—SiMe$_2$O-(Me$_2$SiO)$_{98}$—SiMe$_2$O$_{2/2}$]$_{0.01}$[Me$_2$ViSiO$_{1/2}$]$_{0.06}$. The weight average molecular weight of the resin was 62,000, and the melting point thereof was 60° C.

Synthesis Example 8

—Hydrosilyl Group-Containing Organopolysiloxane Resin (B4)—

After dissolving 27 mol of organosilane represented as PhSiCl$_3$, 1 mol of HOMe$_2$SiO(Me$_2$SiO)$_{98}$SiMe$_2$OH, and 6 mol of Me$_2$HSiCl in a toluene solvent, a toluene solution was dropped in water and cohydrolyzed, further after cleaning with water, and neutralizing and dewatering by alkali cleaning, by stripping the solvent, a hydrosilyl group-containing resin (B4) was synthesized.

In the resin, a constituent ratio of siloxane units which constitute the resin and a structure represented by [—SiMe$_2$O-(Me$_2$SiO)$_{98}$—SiMe$_2$O$_{2/2}$] is denoted by a formula: [PhSiO$_{3/2}$]$_{0.27}$ [—SiMe$_2$O-(Me$_2$SiO)$_{98}$—SiMe$_2$O$_{2/2}$]$_{0.01}$[Me$_2$HSiO$_{1/2}$]$_{0.06}$. The weight average molecular weight of the resin was 60,000, and the melting point thereof was 58° C.

Example 1

With respect to 90 parts by mass of a composition where 189 g of the vinyl group-containing resin (A1) of the Synthesis Example 1, 189 g of the hydrosilyl group-containing resin (B1) of Synthesis Example 2, 0.2 g of acetylene alcohol-based ethynylcyclohexanol as a reaction inhibitor, and 0.1 g of bis(acetylacetonato)platinum (II) (manufactured by Tokyo Chemical Industry Co., Ltd.) were added and dissolved in 10% toluene, 10 parts by mass of a phosphor (YAG) having a particle size (average particle size) of 5 μm were further added and heated at 60° C., cyclohexanone was further added by 20% of the resin composition, the mixture was thoroughly stirred with a planetary mixer, thereby a silicone resin composition was prepared. The composition was a plastic solid in a dried state at 25° C.

1) Chromaticity Measurement

The composition was coated on a PTFE film 50 μm thick (base film for pressurizing) by a film coater at a blade of 100 μm and dried at 100° C. for 2 min to prepare a solid film 50 μm thick. The solid film was further sandwiched between a PTFE film 25 μm thick (peeling film) and formed into sheet-form having a thickness of 50 μm by nipping with a roll.

The resulted composition sheet was cut together with the peeling film into small chips. As is illustrated in FIG. 1, after the resulted film chip was disposed on a GaN LED chip 1 so that a composition side may come into contact with the LED chip, the peeling film was removed. Then, via a photomask where only a contact hole is covered, UV 365 nm was irradiated using a UV-LED irradiator (type name: ZUV-C20H, manufactured by OMRON Corporation)(integrated amount of light: 2000 mJ/cm$^2$). Further, an uncured portion was developed with IPA, this was further heated at 150° C. for 60 min to cure, thereby a phosphor-containing resin cured layer 2 was formed on the LED chip 1. By using the LED chip 1 covered with the phosphor-containing resin cured layer 2 obtained like this, a light-emitting semiconductor (LED) apparatus having a flip-chip structure such as illustrated in FIG. 1 was prepared on a ceramic circuit board 3. In the FIGURE, reference numerals 4 and 5 respectively illustrate a wire contact portion and a gold wire. By making every 3 LEDs emit, the chromaticity was measured by using an LED Optical Characteristic Monitor (type name: LE-3400, manufactured by Otsuka Electronics Co., Ltd.).

2) Mechanical Characteristics

The composition was compression molded by using a compression molding machine, by using a UV-LED irradiator (type name: ZUV-C20H, manufactured by OMRON Corporation), UV 365 nm (integrated amount of light: 2000 mJ/cm$^2$) was irradiated to gelate, this was further cured at 150° C. for 4 hr. The resulted cured material was measured of the tensile strength (0.2 mm thick), the hardness (measured by using a type D spring tester) and the breaking elongation (0.2 mm thick) in accordance with JIS K 6251 and JIS K 6253.

3) Tackiness of Surface

The tackiness of a surface of a cured material cured similarly as the evaluation of the mechanical characteristics was confirmed by touching with a finger. Further, the cured material was embedded in commercially available silver powder (average particle size: 5 μm) and, after taking out, by blowing air, whether the silver powder stuck on the surface like dust can be removed or not was tested.

4) Dispersion Stability of Phosphor

The resin composition immediately after preparation was charged in a recess having a diameter of 6 mm and a depth at a center of 2 mm, which was formed on an alumina substrate, and, by irradiating UV-rays and heat-curing in a manner similar to that in the evaluation of the mechanical characteristics, a disc-like molded product having a thickness of 2 mm and a diameter of 6 mm was molded. From each of an upper superficial layer (thickness: 2 mm) and a lower superficial layer (thickness: 2 mm) of the molded product, a part was cut out and heated at 800° C. to ash, the content (% by mass) of the phosphor in the resulted ash was measured, and the contents in the upper portion and lower portion were compared.

Further, after leaving to stand the composition in a refrigerator at −20° C. for 3 months, the composition was molded in a manner similar to the above, and similarly, the contents of phosphor in the upper portion and lower portion were compared. In this manner, the dispersion stability of the phosphor was measured.

These respective measurement results are shown in Table 1.

Example 2

With respect to 70 parts by mass of a composition where 189 g of the vinyl group-containing resin (A-2) of the Synthesis Example 3, 189 g of the hydrosilyl group-containing resin (B-2) of the Synthesis Example 4, 0.2 g of acetylene alcohol-based ethynylcyclohexanol as a reaction inhibitor, and 0.1 g of (methylcyclopentadienyl)trimethyl platinum (manufactured by Sigma Aldrich Japan K. K.) were added and dissolved in 10% toluene, 30 parts by mass of a phosphor (YAG) having a particle size (average particle size) of 5 were further added, the mixture was thoroughly stirred with a planetary mixer heated at 60° C., thereby a silicone resin composition was prepared. The composition was a plastic solid at 25° C. The composition was evaluated in a manner similar to Example 1. Results thereof are illustrated in Table 1.

Example 3

A composition where 189 g of the vinyl group-containing resin (A-1) of the Synthesis Example 1, 189 g of the hydrosilyl group-containing resin (B-1) of the Synthesis Example 2, 0.2 g of acetylene alcohol-based ethynylcyclohexanol as a reaction inhibitor, and 0.1 g of (methylcyclopentadienyl)trimethyl platinum (manufactured by Sigma Aldrich Japan K. K.) were added and dissolved in 10% toluene was thoroughly stirred with a planetary mixer heated at 60° C., thereby a silicone resin composition was prepared. The composition was a plastic solid at 25° C. The composition was evaluated and results thereof are illustrated in Table 1.

Example 4

A composition where 189 g of the vinyl group-containing resin (A-3) of the Synthesis Example 5, 189 g of the hydrosilyl group-containing resin (B-3) of the Synthesis Example 6, 0.2 g of acetylene alcohol-based ethynylcyclohexanol as a reaction inhibitor, and 0.1 g of (methylcyclopentadienyl)trimethyl platinum (manufactured by Sigma Aldrich Japan K. K.) were added and dissolved in 10% toluene was thoroughly stirred with a planetary mixer heated at 60° C., thereby a silicone resin composition was prepared. The composition was a plastic solid at 25° C. The composition was evaluated and results thereof are illustrated in Table 1.

Example 5

A composition where 189 g of the vinyl group-containing resin (A-4) of the Synthesis Example 7, 189 g of the hydrosilyl group-containing resin (B-4) of the Synthesis Example 8, 0.2 g of acetylene alcohol-based ethynylcyclohexanol as a reaction inhibitor, and 0.1 g of (methylcyclopentadienyl)trimethyl platinum (manufactured by Sigma Aldrich Japan K. K.) were added and dissolved in 10% toluene was thoroughly stirred with a planetary mixer heated at 60° C., thereby a silicone resin composition was prepared. The composition was a plastic solid at 25° C. The composition was evaluated and results thereof are illustrated in Table 1.

Comparative Example 1

In place of the silicone resin composition prepared in the Example 1, 90 parts by mass of a commercially available addition reaction-curable silicone varnish, KJR-632 (trade name, manufactured by Shin-Etsu Chemical Co., Ltd.) that does not contain a linear diorganopolysiloxane chain architecture having the number of repetitions of 5 to 300 and contains as a main component a vinyl group-containing organopolysiloxane resin that is liquid at room temperature, were used, further, after 10 parts by mass of the phosphor (YAG) having a particle size of 5 μm (average particle size), which is the same as that of the Example 1, were added, a composition obtained by thoroughly stirring with a planetary mixer heated at 60° C. was cured under the curing condition described in Table 1, and the respective characteristics were evaluated. Results are illustrated in Table 1.

Comparative Example 2

In place of the silicone resin composition prepared in the Example 1, 70 parts by mass of a commercially available addition reaction-curable silicone varnish, KJR-632L-1 (trade name, manufactured by Shin-Etsu Chemical Co., Ltd.) that does not contain a linear diorganopolysiloxane chain architecture having the number of repetitive units of 5 to 300 and contains as a main component a vinyl group-containing organopolysiloxane resin that is liquid at room temperature, were used, further, after 30 parts by mass of the phosphor (YAG) having a particle size of 5 (average particle size), which is the same as that of the Example 1, were added, a composition obtained by thoroughly stirring with a planetary mixer heated at 60° C. was cured under the curing condition described in Table 1, and the respective characteristics were evaluated. Results are illustrated in Table 1.

The UV-curable adhesive silicone compositions according to Examples 1 to 5 could be cured without allowing the composition to flow during heat-curing but with an initial shape maintained. Further, according to the compositions of Example 1 and Example 2, a resin-cured layer in which the phosphor is uniformly dispersed and the dispersion state thereof is stable with time could be obtained. Still further, when a sheet formed from the composition was used, only on a necessary portion, a resin-cured layer can be formed according to lithography.

The present invention is not limited to the embodiments. The embodiments are only illustrative examples. All of what has a constitution essentially the same as that of a technical idea described in the range of Claims of the invention and exerts the same effect is included in the technical range of the invention.

What is claimed is:

1. A method of manufacturing an optical semiconductor apparatus, comprising the steps of:
   cutting a UV-curable adhesive silicone composition sheet into small chips;
   disposing the resulted UV-curable adhesive silicone composition sheet chip on a surface of an optical semiconductor device;
   irradiating UV-rays to the UV-curable adhesive silicone composition sheet chip via a photomask according to lithography;

TABLE 1

|  | Example 1 | | Example 2 | | Example 3 | | Example 4 | | Example 5 | | Comparative Example 1 | | Comparative Example 2 | |
| --- | --- | --- | --- | --- | --- | --- | --- | --- | --- | --- | --- | --- | --- | --- |
| SiH/SiVi[X1] | 1.0 | | 1.0 | | 1.0 | | 1.0 | | 1.0 | | 1.0 | | 1.0 | |
| UV irradiation condition Processing of contact hole | 2000 mJ possible | | 2000 mJ possible | | 2000 mJ possible | | 2000 mJ possible | | 2000 mJ possible | | — impossible | | — impossible | |
| Curing condition | 150° C./1 hr | | 150° C./1 hr | | 150° C./1 hr | | 150° C./1 hr | | 150° C./1 hr | | 150° C./1 hr | | 150° C./1 hr | |
| Chromaticity n | x | y | x | y | x | y | x | y | x | y | x | y | x | y |
| 1 | 0.310 | 0.310 | 0.310 | 0.310 | — | — | — | — | — | — | 0.310 | 0.315 | 0.312 | 0.315 |
| 2 | 0.311 | 0.310 | 0.311 | 0.310 | — | — | — | — | — | — | 0.305 | 0.321 | 0.314 | 0.310 |
| 3 | 0.310 | 0.310 | 0.310 | 0.310 | — | — | — | — | — | — | 0.310 | 0.316 | 0.310 | 0.322 |
| Tensile strength (MPa) | 8 | | 8 | | 7 | | 7 | | 8 | | 1 | | 1 | |
| Hardness | 55 | | 60 | | 40 | | 40 | | 38 | | 75 | | 80 | |
| Breaking elongation (%) | 15 | | 15 | | 30 | | 30 | | 40 | | 0 | | 0 | |
| Adherence of dust due to surface tackiness | None | | None | | None | | None | | None | | None | | None | |
| Dispersion of phosphor (immediate after) Wt ratio | No difference (100/10) | | No difference (100/10) | | — | | — | | — | | Upper portion (100/8) Lower portion (100/12) | | Upper portion (100/26) Lower portion (100/33) | |
| Dispersion of phosphor (after 3 months) Wt ratio | No difference (100/10) | | No difference (100/10) | | — | | — | | — | | Upper portion (100/2) Lower portion (100/18) | | Upper portion (100/3) Lower portion (100/50) | |

(Note)
[X1] A mole ratio of hydrogen atoms bonded to silicon atoms in a hydrosilyl group-containing resin with respect to vinyl groups bonded to a silicon atom in a vinyl group-containing resin.

developing an uncured portion of the UV-curable adhesive silicone composition sheet chip with a solvent; and heat-curing after that, wherein the UV-curable adhesive silicone composition sheet is obtained by forming a UV-curable adhesive silicone composition into sheet-form, the UV-curable adhesive silicone composition comprising:

(A) an organopolysiloxane having a resin structure consisting of $R^1SiO_{3/2}$, $R^2{}_2SiO_{2/2}$, and $R^3{}_aR^4{}_bSiO_{(4-a-b)/2}$ units, wherein, $R^1$, $R^2$ and $R^3$ each independently represent any one of a hydroxyl group, a methyl group, an ethyl group, a propyl group, a cyclohexyl group, and a phenyl group, $R^4$ represents a vinyl group or an allyl group, a represents 0, 1 or 2, b represents 1, 2 or 3, and a+b represents 2 or 3, wherein at least a part of $R^2{}_2SiO_{2/2}$ units is continuously repeated and the number of repetitions thereof is 5 to 300, (B) an organohydrogenpolysiloxane having a resin structure consisting of $R^1SiO_{3/2}$, $R^2{}_2SiO_{2/2}$, and $R^3{}_cH_dSiO_{(4-c-d)/2}$ units, wherein $R^1$, $R^2$ and $R^3$ each independently represent the same as that described above, c represents 0, 1 or 2, d represents 1 or 2, and c+d represents 2 or 3, wherein at least a part of $R^2{}_2SiO_{2/2}$ units is continuously repeated and the number of repetitions thereof is 5 to 300, and (C) a photoactive catalyst, and the UV-curable adhesive silicone composition is in a plastic solid state or a semi-solid state in an uncured state at room temperature.

2. The method of manufacturing an optical semiconductor apparatus according to claim 1, wherein the UV-curable adhesive silicone composition further contains (D) a phosphor.

3. The method of manufacturing an optical semiconductor apparatus according to claim 2, wherein 0.1 to 100 parts by mass of the phosphor of the (D) component are contained with respect to 100 parts by mass of a sum total of the (A) to (C) components.

4. The method of manufacturing an optical semiconductor apparatus according to claim 2, wherein a particle size of the (D) phosphor is 10 nm or more.

5. The method of manufacturing an optical semiconductor apparatus according to claim 3, wherein a particle size of the (D) phosphor is 10 nm or more.

6. The method of manufacturing an optical semiconductor apparatus according to claim 1, wherein the total number of moles of hydrogen atoms directly bonded to silicon atoms in the (B) component with respect to the total number of moles of vinyl groups and allyl groups in the (A) component is an amount to be 0.1 to 4.0 by mole ratio.

7. The method of manufacturing an optical semiconductor apparatus according to claim 2, wherein the total number of moles of hydrogen atoms directly bonded to silicon atoms in the (B) component with respect to the total number of moles of vinyl groups and allyl groups in the (A) component is an amount to be 0.1 to 4.0 by mole ratio.

8. The method of manufacturing an optical semiconductor apparatus according to claim 3, wherein the total number of moles of hydrogen atoms directly bonded to silicon atoms in the (B) component with respect to the total number of moles of vinyl groups and allyl groups in the (A) component is an amount to be 0.1 to 4.0 by mole ratio.

9. The method of manufacturing an optical semiconductor apparatus according to claim 4, wherein the total number of moles of hydrogen atoms directly bonded to silicon atoms in the (B) component with respect to the total number of moles of vinyl groups and allyl groups in the (A) component is an amount to be 0.1 to 4.0 by mole ratio.

10. The method of manufacturing an optical semiconductor apparatus according to claim 5, wherein the total number of moles of hydrogen atoms directly bonded to silicon atoms in the (B) component with respect to the total number of moles of vinyl groups and allyl groups in the (A) component is an amount to be 0.1 to 4.0 by mole ratio.

11. The method of manufacturing an optical semiconductor apparatus according to claim 1, wherein at least one of the $R^1$, $R^2$ and $R^3$ is a hydroxyl group.

12. The method of manufacturing an optical semiconductor apparatus according to claim 2, wherein at least one of the $R^1$, $R^2$ and $R^3$ is a hydroxyl group.

* * * * *